July 13, 1965 F. F. OFFNER 3,195,064
TRANSISTOR POWER AMPLIFIER EMPLOYING COMPLEMENTARY SYMMETRY AND NEGATIVE FEEDBACK
Original Filed Feb. 2, 1959
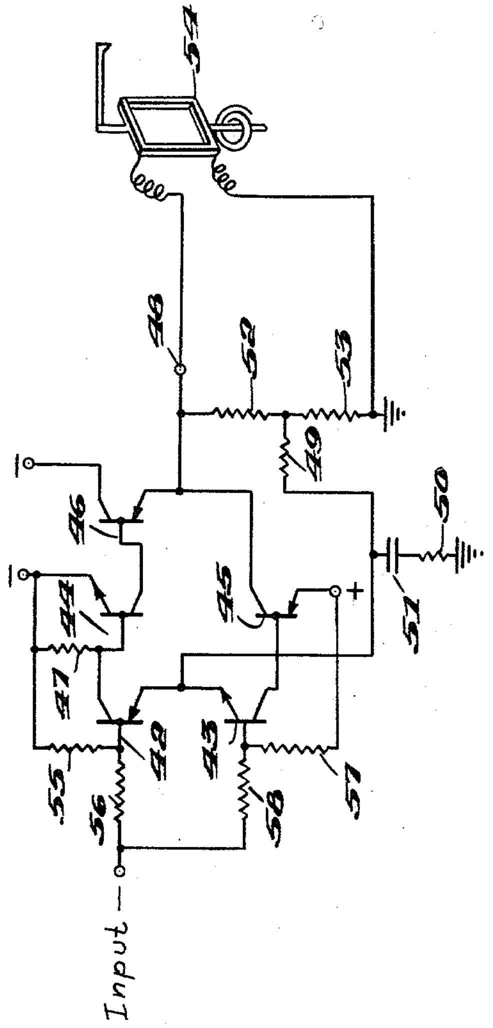
INVENTOR
FRANKLIN F. OFFNER,
BY Pierce, Scheffler & Parker
ATTORNEYS United States Patent Office 3,195,064
Patented July 13, 1965

3,195,064

TRANSISTOR POWER AMPLIFIER EMPLOYING COMPLEMENTARY SYMMETRY AND NEGATIVE FEEDBACK

Franklin F. Offner, 1890 Telegraph Road, Deerfield, Ill.

Original application Feb. 2, 1959, Ser. No. 790,498. Divided and this application May 28, 1964, Ser. No. 370,881
2 Claims. (Cl. 330—13)

This invention relates to electronic amplifiers of the transistor type, and in particular to an amplifier of improved power handling capacity. The present application is a division of my co-pending application Serial No. 790,498, filed February 2, 1959.

The invention is illustrated in the accompanying drawing which is an electrical schematic of the improved amplifier. In this embodiment of the invention, it is illustrated as used in operating a galvanometer type recorder, but the invention is useful in other unrelated applications as well.

The amplifier is, in some ways, similar to the amplifier illustrated in my prior U.S. Patent No. 3,079,565, granted February 26, 1963, but has such advantages, particularly in having higher gain possibilities so that, if desired, a voltage gain may be obtained in this section of the amplifier. The improved power amplifier employs two power transistors 45, 46, both of which are the PNP type. The upper half of the amplifier, as illustrated, consists of PNP input transistor 42, followed by NPN transistor 44. The latter drives output transistor 46.

The lower half of the power amplifier employs only two transistors; NPN input transistor 43 directly drives PNP output transistor 45. Already well known to the art are transistor amplifiers employing complementary asymmetry, and thus employing one each NPN and PNP power transistors. The present amplifier would be of this type if transistor 46 were eliminated, and the load terminal 48 connected to the collectors of transistors 44 and 45. In this event, transistor 44 would be of the power type. It is seen, however, that PNP power transistor 46 may be inserted, as shown, maintaining the correct phase of output signal, since it is connected to an "emitter follower" type of connection. In this way, it is unnecessary that transistor 44 be of the power NPN type, a type of transistor which is more difficult to produce than the power PNP type.

The provision of three transistor stages in the upper half of the power amplifier, with only two transistor stages in the lower half, would result in an unsymmetrical gain since, in the amplifier illustrated, the upper half conducts the negative input signals and the lower half the positive input signals. However, sufficient feedback is applied to the common emitter circuit of transistors 42, 43 to make the gain substantially independent of the transistor gains. This feedback is applied through resistor 49, which is supplied through a resistance type voltage divider 52, 53. These latter two resistors are so proportioned as to determine the amount of feedback employed, allowing the control of the maximum amplification of the power amplifier. The function of condenser 51, in conjunction with resistor 50, these two elements being series connected between ground and the feedback path, is to correct the frequency response of the power amplifier, to compensate for the falling frequency response of the direct writing oscillograph coil 54 which is connected across the output terminal 48 and ground. The resonance and inertia effects of coil 54 which may be of the d'Arsonval type operating in a constant magnetic field, will cause a lesser deflection to be obtained above the resonance frequency. Condenser 51 is so proportional as to partially compensate for this effect. However, a minimum value of feedback is desired, even at elevated frequencies. This minimum feedback is determined by resistor 50 in series with condenser 51.

The function of resistors 55, 56, 57 and 58 is to ensure that the amplifier sections are both operating in a region in which they are sensitive to input signals, even with very low input signals. This is more fully explained in my aforesaid Patent No. 3,079,565. The provision of three stages in the upper half of this amplifier presents a possible problem, if the leakage currents from transistor 42 should become appreciably large. Such leakage currents will be amplified by both succeeding stages, and might reach too large a proportion in the output of transistor 46. To prevent this from occurring resistor 47 is placed from base to emitter of transistor 44. The function of resistor 47 is to by-pass a portion of the output of transistor 42, and particularly, the leakage current. While so by-passing the output of transistor 42, it will reduce the amplification of the upper half of the power amplifier, but since this portion of the amplifier already has a superfluity amplification, this does not result in any undesired effects. Furthermore, resistor 47 may be so proportioned that it has a value low compared to the base input resistance of transistor 44, in the region of low signal levels, where the leakage currents are important, but a value which is high compared to the base input resistance of transistor 44, in the region of high signal levels, so that under such conditions, it will not substantially reduce the amplification. This proportioning is possible since the base input resistance of a transistor falls substantially when the current carried by the transistor is increased. If, for example, under no signal conditions, transistor 44 carries $1/10$ of a milliampere collector current, its input resistance may be in the vicinity of 10,000 ohms. If, however, under full signal conditions, transistor 44 carries 5 milliamperes current, its base input resistance may be only about 200 ohms. Thus, if resistor 47 has 1,000 ohms, it would have the desired proportioning to the base resistance of transistor 44. Input to the amplifier is connected in at the terminal legended "Input."

The output load is shown as galvanometer coil 54. However, it is apparent that other loads could be connected to point 48. If the characteristics do not require frequency compensation, capacitor 51, and resistors 49 and 50 may be eliminated, the emitters of 42 and 43 being connected directly to the junction point of 52 and 53. Also, if inverse feedback around the power amplifier is not desired, the emitters of 42 and 43 may be grounded directly. A further evident modification is to make resistor 52 itself the load, thus providing current feedback.

I claim:

1. A power amplifier of the transistor type comprising a first PNP power transistor having its collector connected to a source of negative voltage and its emitter connected to the load terminal, a second PNP power transistor having its emitter connected to a source of positive voltage and its collector connected to said load terminal, an NPN transistor having its collector connected to the base of said first power transistor and its emitter connected to a source of negative voltage, a PNP transistor having its collector connected to the base of said NPN transistor, a second NPN transistor having its collector connected to the base of said second PNP power transistor, a circuit connection between the emitter of said second NPN transistor and the emitter of said PNP transistor, and a source of signal voltage connected to the base of said second NPN transistor and to said PNP transistor.

2. A power amplifier as defined in claim 1, and which further includes means deriving negative feedback from the output of said power amplifier, said feedback being connected to the emitter of said PNP transistor and to the emitter of said second NPN transistor.

No references cited.

ROY LAKE, *Primary Examiner.*

NATHAN KAUFMAN, *Examiner.*